(12) United States Patent
Wirth

(10) Patent No.: US 8,889,982 B2
(45) Date of Patent: Nov. 18, 2014

(54) CONCENTRATOR FOR SOLAR RADIATION AND USE THEREOF

(75) Inventor: Harry Wirth, Merzhausen (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 744 days.

(21) Appl. No.: 12/736,092

(22) PCT Filed: Mar. 2, 2009

(86) PCT No.: PCT/EP2009/001470
§ 371 (c)(1),
(2), (4) Date: Dec. 22, 2010

(87) PCT Pub. No.: WO2009/115182
PCT Pub. Date: Sep. 24, 2009

(65) Prior Publication Data
US 2011/0083740 A1   Apr. 14, 2011

(30) Foreign Application Priority Data
Mar. 17, 2008   (DE) .......................... 10 2008 014 618

(51) Int. Cl.
| H01L 31/00 | (2006.01) |
| F24J 2/06 | (2006.01) |
| F24J 2/10 | (2006.01) |
| G02B 27/10 | (2006.01) |
| G02B 27/12 | (2006.01) |
| H01L 31/052 | (2014.01) |

(52) U.S. Cl.
CPC ................ F24J 2/062 (2013.01); F24J 2/1047 (2013.01); G02B 27/106 (2013.01); G02B 27/126 (2013.01); H01L 31/0522 (2013.01); Y02B 10/20 (2013.01); Y02E 10/40 (2013.01); Y02E 10/52 (2013.01)
USPC .......................................... 136/259; 136/246

(58) Field of Classification Search
CPC ....................................................... F24J 2/062
USPC .................................................. 136/243–265
See application file for complete search history.

(56) References Cited

U.S. PATENT DOCUMENTS

| 4,200,472 | A | * | 4/1980 | Chappell et al. ............... 136/246 |
| 4,337,759 | A | * | 7/1982 | Popovich et al. ............. 126/684 |
| 5,977,478 | A | | 11/1999 | Hibino et al. |
| 6,577,447 | B1 | * | 6/2003 | Ai et al. ........................ 359/626 |
| 7,253,955 | B2 | | 8/2007 | Watanabe et al. |
| 7,713,611 | B2 | | 5/2010 | Kim et al. |
| 2006/0139749 | A1 | * | 6/2006 | Watanabe et al. ............. 359/460 |
| 2007/0227581 | A1 | | 10/2007 | Chen et al. |
| 2007/0227582 | A1 | | 10/2007 | Chen et al. |

FOREIGN PATENT DOCUMENTS

| EP | 0 144 611 A1 | 6/1985 |
| WO | WO 00/70275 A1 | 11/2000 |
| WO | WO 01/55650 A2 | 8/2001 |

* cited by examiner

Primary Examiner — Jeffrey T Barton
Assistant Examiner — Niki Bakhtiari
(74) Attorney, Agent, or Firm — Marshall & Melhorn, LLC

(57) ABSTRACT

The invention relates to a concentrator arrangement for solar radiation which has a beam splitter for deflecting solar radiation by means of total reflection. Furthermore, the invention relates to a device for concentrating and converting solar energy which has such a concentrator and at least one device for the conversion of solar energy. Such devices for the conversion of solar energy are for example solar cells, solar modules or thermal solar collectors. The concentrators according to the invention are used for concentrating solar radiation just as in sun protection panels.

17 Claims, 5 Drawing Sheets

CONCENTRATOR FOR SOLAR RADIATION AND USE THEREOF

BACKGROUND OF THE INVENTION

The invention relates to a concentrator arrangement for solar radiation which has a beam splitter for deflecting solar radiation by means of total reflection. Furthermore, the invention relates to a device for concentrating and converting solar energy which has such a concentrator and at least one device for the conversion of solar energy. Such devices for the conversion of solar energy are for example solar cells, solar modules or thermal solar collectors. The concentrators according to the invention are used for concentrating solar radiation just as in sun protection panels.

In the field of photovoltaics, approaches have been made for many years to concentrate the solar radiation in order to minimise the quantity of solar cell material and, on the other hand, to achieve higher efficiency. The principle is based on the fact that solar radiation is concentrated with mirrors and/or lenses and directed onto special concentrator solar cells. Hence, the photovoltaically active surface is reduced and hence the necessary quantity of expensive solar cell materials. Due to the concentration of the solar radiation which acts on photovoltaically active surfaces, the costs for solar power can be reduced. This applies in particular for regions with a high direct radiation component.

In the state of the art, there are used for concentrating solar radiation on small-area photovoltaically active surfaces, refractive (U.S. Pat. No. 5,977,478) or metallic-reflecting or total-reflecting elements (US 2007/0227582).

For photovoltaically active surfaces with larger dimensions, e.g. standard solar cells with a standard surface area of 150×150 mm or standard solar modules with a typical surface area of 1,000×2,000 mm, refractive or metallic-reflecting elements are only suitable to a limited extent because they do not permit compact arrangements. Refractive Fresnel lenses which are structured on one side enable for example merely deflection angles up to at most 40°. As a result, the spacing between lens plane and receiver plane, in comparison to the dimension of the lens, is very large.

BRIEF SUMMARY OF THE INVENTION

It is therefore the object of the invention to provide a compact concentrator which makes possible a significant reduction in the surface extension of devices coupled to the concentrators for the conversion of solar energy.

This object is achieved by a concentrator for solar radiation comprising at least one beam splitter for deflecting solar radiation, the beam splitter having, on the side orientated away from the solar radiation, a structuring which deflects solar radiation impinging on the radiation splitter in two different directions by means of total reflection and by a device for concentrating and converting solar energy comprising at least one such concentrator and at least one device for the conversion of solar energy, the at least one concentrator being positioned such that the solar radiation deflected by the beam splitter is directed onto the at least one device for the conversion of solar energy.

According to the invention, a concentrator for solar radiation is provided, which has at least one beam splitter for deflecting solar radiation. The beam splitter thereby has, on the side orientated away from the solar radiation, a structuring which deflects solar radiation impinging on the beam splitter in two different directions by means of total reflection.

The structuring of the beam splitters according to the invention leads to a deflection of the incident solar radiation at a high deflection angle, as a result of which the active surfaces, via which the conversion of the solar energy is effected, can be disposed very close to the beam splitter and hence enables a very compact arrangement of the module. A further advantage resides in the fact that, despite the flat design of the concentrator according to the invention, shading losses can be extensively prevented.

It is preferred that the structuring consists of a plurality of structural elements which repeat periodically over the entire surface.

Another preferred alternative provides that the structuring consists of a plurality of differing structural elements, the individual structural elements being coordinated to each other such that an at least partial concentration of the deflected radiation onto the active surface is effected.

The structuring is preferably configured in the form of essentially isosceles prisms. Such prisms can thereby have a base angle in the range of 45° to 75°, in particular of 55° to 65°.

A preferred embodiment provides that the base angles of the prisms are varied such that an at least partial concentration of the deflected radiation is effected.

The beam splitter preferably consists of a structurable substrate having a transmission of at least 85% in the wavelength range of 400 to 1,100 nm. There are included herein, in particular glass and/or polymer materials. In the present variant according to the invention, the surface of the substrate orientated towards the at least one photovoltaically active surface has a structuring.

A further preferred embodiment provides that the beam splitter consists of a substrate having a transmission of at least 85% in the wavelength range of 400 to 1,100 nm, which has, on the surface of the substrate orientated towards the at least one photovoltaically active surface, a structured layer made of a polymer material. This polymer material is preferably selected from the group consisting of fluorine-, acrylate- and/or silicone polymers.

Furthermore, it is preferred that the structuring of the beam splitter has an essentially identical structural depth over the entire surface in the direction of the plane normal to the surface which is preferably in the range of 10 µm to 20 mm, particularly preferred in the range of 50 µm to 5 mm.

The structuring can thereby have been introduced by casting, injection moulding, extrusion and/or embossing.

The beam splitter can preferably be configured also as a planar disc or plate.

Likewise, the beam splitter can have a spectrally selective transmission to favour the photovoltaically usable spectral component, inter alia with maximum transmissions in the range of 400 nm to 1,100 nm.

According to the invention, a device for concentrating and converting solar energy is provided, which has at least one concentrator, as described previously, and at least one device for the conversion of solar energy. The at least one concentrator is thereby positioned such that the solar radiation deflected by the beam splitter is directed onto the at least one device for the conversion of solar energy.

The device for the conversion of solar energy preferably concerns solar cells, solar modules or thermal solar collectors.

A further preferred embodiment of the device provides that the device for the conversion of solar energy has, on the surface orientated towards the solar radiation, an antireflection coating. This preferably consists of a material with lower light refraction for the conversion of solar energy relative to the substrate material of the device. However, also corresponding material arrangements, e.g. nanoporous glass, can be used.

Preferably, the device for concentrating and converting solar energy has in addition an arrangement for uniaxial or biaxial trackability relative to the position of the sun.

The previously described concentrators are used for concentrating solar radiation onto photovoltaically active components. Thus the concentrators can be used for construction of concentrating photovoltaic modules. There can be used as cells or modules, commercially available silicon cells or silicon modules for non-concentrating use. When these photovoltaic modules are tracked, they can also be mounted on normal solar trackers. Likewise, it is possible that such systems uniaxially track the sun for a few days at a time manually.

Likewise, it is possible that the concentrators according to the invention are used in conjunction with thermal solar collectors which induce conversion of solar energy into heat.

With corresponding dimensioning, the concentrators according to the invention can also be used in or as sun protection panels for buildings. The panels here would be rotatable about their longitudinal axis and hence trackable uniaxially.

BRIEF DESCRIPTION OF THE DRAWINGS

The subject according to the invention is intended to be explained in more detail with reference to the subsequent Figures without wishing to restrict said subject to the special embodiments shown here.

DETAILED DESCRIPTION OF THE INVENTION

Figure 1:
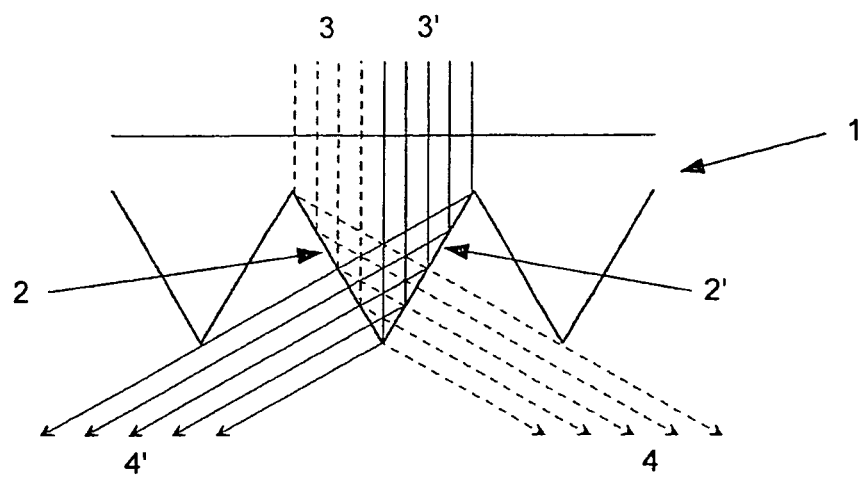
FIG. 1 shows a beam splitter used according to the invention with reference to a schematic representation.

In FIG. 1, a beam splitter 1 is represented in cross-section, which beam splitter deflects incident solar radiation by +/−60° and thus splits it into two different directions. The light beam 3 is hereby deflected such that it leaves the beam splitter as light beam 4, whilst the light beam 3' is deflected such that it leaves the beam splitter as beam 4'. As a result of this splitting, the radiation is also completely deflected without refraction. Reflection losses hereby occurring at the interfaces of the beam splitter to the air are approx. 8%. These reflection losses can be reduced to a value of approx. 3% as long as corresponding antireflection coatings are used.

Figure 2:
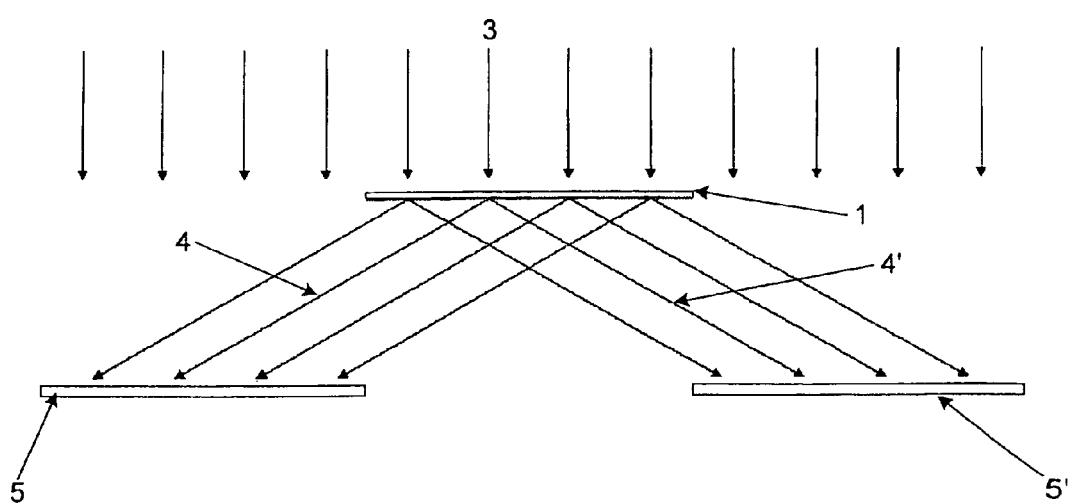
FIG. 2 shows a concentrator according to the invention with reference to a schematic representation.

In FIG. 2, a concentrator according to the invention is illustrated, which concentrator has a beam splitter 1 via which solar radiation 3 is deflected into a first bundle of rays 4 and a second bundle of rays 4'. The bundle of rays 4 is thereby deflected towards the active surface 5, e.g. a solar cell surface, whilst the second bundle of rays 4' is deflected towards the photovoltaically active surface 5'. A geometric concentration by the factor 1.5 can be achieved with such an arrangement.

Figure 3:
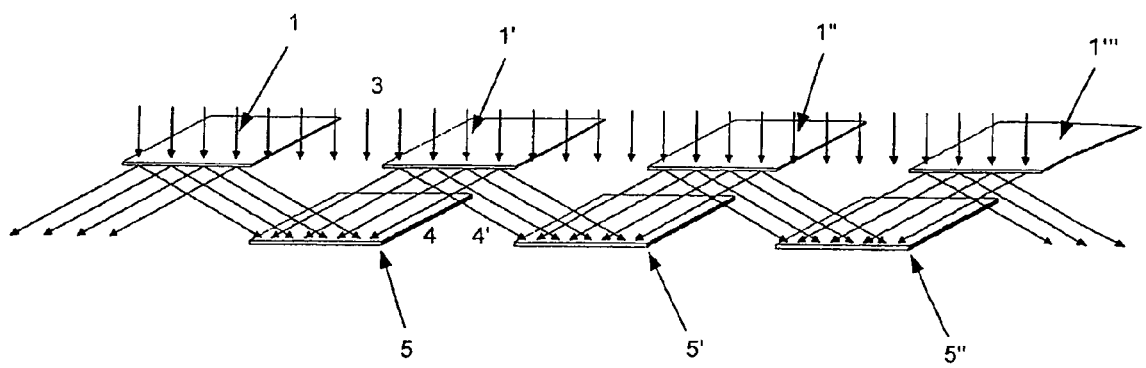
FIG. 3 shows the arrangement of a plurality of beam splitters in conjunction with corresponding active surfaces with reference to a schematic representation.

The arrangement, shown in FIG. 2, of a beam splitter and two photovoltaically active surfaces can be arbitrarily extended in both spatial directions, e.g. an array-like arrangement. In this case, a geometric concentration by the factor 2 is produced. An example of this is represented in FIG. 3, in which a linear arrangement of beam splitters 1 and active surfaces 5, 5' and 5", e.g. solar cell surfaces, is represented. The incident solar radiation 3 is thereby split into two bundles of rays 4 and 4', e.g. via the beam splitter 1', which then impinge on the corresponding active surfaces 5 and 5'.

Figure 4:
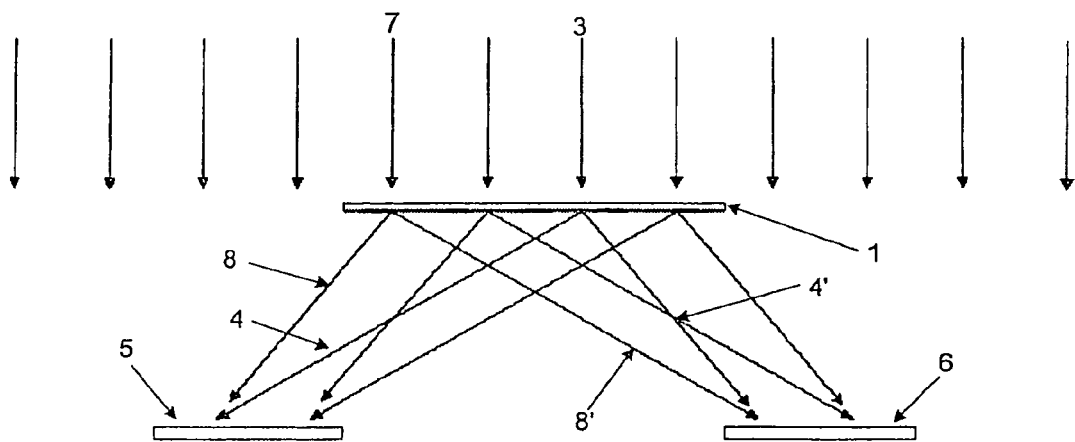
FIG. 4 shows a second variant of a concentrator according to the invention with reference to a schematic representation.

In FIG. 4, a further variant of the concentrator according to the invention is represented. Incident sunlight 3, 7 is hereby deflected by the beam splitter 1. The two beams 3 and 7 impinge at different places on the beam splitter 1, different structural elements being configured in the respective regions. This leads to the fact that the deflected bundle of rays 4 of the incident sunbeam 3 with the deflected bundle of rays 8 of the incident sunbeam 7 impinge at one point on the photovoltaically active surface 5 and the result therefore is a concentration of the sunlight at this point. The same applies for the bundles of rays 4' and 8' on the adjacent photovoltaically active surface 6.

Thus, it is possible due to a slight variation in the structural elements to concentrate the deflected radiation. Hence, the photovoltaically active surfaces can be halved, as a result of which the geometric concentration increases from a factor 2 to the factor 3 or more.

Figure 5:
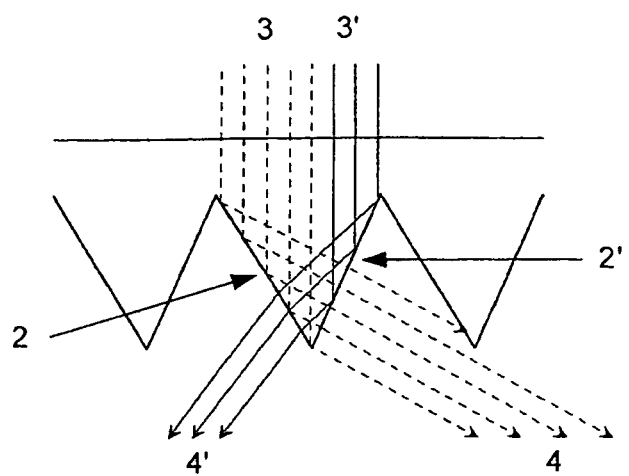
FIG. 5 shows a further variant according to the invention of a beam splitter with reference to a schematic representation.

In FIG. 5, a variant according to the invention which is based on an asymmetrical principle is represented. The flank angles of the flanks 2 and 2' here are 59° or 66.7°. This leads to the fact that solar radiation 3 is deflected at a different angle from solar radiation 3'.

The invention claimed is:

1. A device for concentrating and converting solar energy, comprising at least one concentrator comprising at least one beam splitter for deflecting solar radiation, the beam splitter is configured to have a side oriented towards a source of solar radiation and a side oriented away from the source of solar radiation, the beam splitter having, on the side orientated away from the solar radiation, a structuring which deflects solar radiation impinging on the beam splitter in two different directions by means of total reflection, and at least two devices for the conversion of solar energy which are arranged in an offset manner, the at least one concentrator being positioned between the two devices for the conversion of solar energy and in the direction of incident solar radiation in front of two devices for the conversion of solar energy, such that one part of incident solar radiation directly impinges on the two devices for the conversion of solar energy without impinging on the beam splitter, and such that the solar radiation deflected by the beam splitter is directed onto the two devices for the conversion of solar energy between which the concentrator is localized, wherein the beam splitter is configured as a planar disc or plate and the structuring is configured in the form of essentially isosceles prisms.

2. The device for concentrating and converting solar energy according to claim 1, wherein the structuring consists of a plurality of structural elements which repeat periodically over the surface.

3. The device for concentrating and converting solar energy according to claim 1, wherein the prisms have a base angle in the range of 45° to 75°.

4. The device for concentrating and converting solar energy according to claim 1, wherein the prisms have a base angle in the range of 55° to 65°.

5. The device for concentrating and converting solar energy according to claim 1, wherein the beam splitter is comprised of a structurable substrate having a transmission of at least 85% in the wavelength range of 400 to 1,100 nm, wherein this substrate has a surface orientated towards the at least one photovoltaically active surface which surface has a structuring.

6. The device for concentrating and converting solar energy according to claim 1, wherein the beam splitter is comprised of a structurable substrate made of glass or a polymer material.

7. The device for concentrating and converting solar energy according to claim 1, wherein the beam splitter consists of a substrate having a transmission of at least 85% in the wavelength range of 400 to 1,100 nm, which has a surface orientated towards the at least one photovoltaically active surface, and on this surface is a structured layer made of a polymer material.

8. The device for concentrating and converting solar energy according to claim 7, wherein the polymer material is selected from the group consisting of fluorine-, acrylate- and/or silicone polymers.

9. The device for concentrating and converting solar energy according to claim 1, wherein a plane is defined normal to the surface, and the structuring has an essentially identical structural depth over the surface in the direction of the plane normal to the surface in the range of 10 µm to 20 mm.

10. The device for concentrating and converting solar energy according to claim 1, wherein a plane is defined normal to the surface, and the structuring has an essentially identical structural depth over the surface in the direction of the plane normal to the surface in the range of 50 µm to 5 mm.

11. The device for concentrating and converting solar energy according to claim 1, wherein the structuring was introduced by casting, injection moulding, extrusion and/or embossing.

12. The device for concentrating and converting solar energy according to claim 1, wherein the beam splitter has a spectrally selective transmission to favour the photovoltaically usable spectral component.

13. The device for concentrating and converting solar energy according to claim 1, wherein the device for the conversion of solar energy is a solar cell, a solar module or a thermal solar collector.

14. The device for concentrating and converting solar energy according to claim 13, wherein the device for the conversion of solar energy has, on the surface orientated towards the source of solar radiation, an antireflection coating.

15. The device for concentrating and converting solar energy according to claim 13, wherein the device for the conversion of solar energy has, on the surface orientated towards the source of solar radiation, an antireflection coating made of a material with lower light refraction relative to the substrate material.

16. The device for concentrating and converting solar energy according to claim 1, wherein the device has an arrangement for uniaxial or biaxial trackability relative to the source of solar radiation.

17. A method of converting solar energy, comprising concentrating solar radiation onto a device for conversion of solar energy utilizing a device for concentrating and converting solar energy according to claim 1.

* * * * *